United States Patent
Yang (10) Patent No.: US 11,632,877 B2
(45) Date of Patent: Apr. 18, 2023

(54) VAPOR CHAMBER AND ASSEMBLY METHOD THEREOF

(71) Applicant: Delta Electronics, Inc., Taoyuan (TW)

(72) Inventor: Shu-Cheng Yang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 49 days.

(21) Appl. No.: 16/905,775

(22) Filed: Jun. 18, 2020

(65) Prior Publication Data

US 2021/0144886 A1 May 13, 2021

(30) Foreign Application Priority Data

Nov. 12, 2019 (CN) .......................... 201911100002.7

(51) Int. Cl.
*B23P 15/26* (2006.01)
*H05K 7/20* (2006.01)
*F28F 9/26* (2006.01)

(52) U.S. Cl.
CPC .......... *H05K 7/20336* (2013.01); *B23P 15/26* (2013.01); *F28F 9/26* (2013.01); *B23P 2700/09* (2013.01)

(58) Field of Classification Search
CPC ... H05K 7/20336; H05K 7/2039; B23P 15/26; B23P 2700/09; B23P 2700/10; F28F 9/26; H01L 21/4882; H01L 23/427; H01L 23/036; F28D 15/046; F28D 15/04; F28D 15/0233; F28D 15/0266; G06F 1/20
See application file for complete search history.

(56) References Cited

U.S. PATENT DOCUMENTS

2011/0088877 A1* 4/2011 Oniki .................... F28D 15/046
165/104.26
2020/0326134 A1* 10/2020 Chen ................... F28D 15/0233

* cited by examiner

*Primary Examiner* — Jun S Yoo
(74) *Attorney, Agent, or Firm* — Kirton McConkie; Evan R. Witt (57) ABSTRACT

A vapor chamber and an assembly method thereof are provided. The vapor chamber includes a mesh structure including a main body and an extension part. The main body and the extension part have a capillary-wick structure, respectively. The extension part is extended outwardly from a side of the main body and folded along an intersection between the extension part and the main body. The extension part is stacked on the main body. An overlapping area is formed by stacking the extension part on the main body, and the overlapping area fails to contact with a support structure. The main body is disposed on a first concave of the lower case. The upper case covers the lower case and is assembled with the lower case. A second concave of the upper case and the first concave collaboratively form a space. The mesh structure is accommodated within the space.

9 Claims, 10 Drawing Sheets

VAPOR CHAMBER AND ASSEMBLY METHOD THEREOF

CROSS-REFERENCE TO RELATED APPLICATION

This application claims priority to China Patent Application No. 201911100002.7, filed on Nov. 12, 2019. The entire contents of the above-mentioned patent application are incorporated herein by reference for all purposes.

FIELD OF THE INVENTION

The present disclosure relates to a vapor chamber and an assembly method thereof, and more particularly to a vapor chamber including a multi-layer structure constituted by a single mesh structure and an assembly method thereof.

BACKGROUND OF THE INVENTION

Nowadays, efficiency enhancement of the electronic device has resulted in increased power demands of the electronic elements disposed in an interior of the electronic device. Therefore, heat dissipation has become an important issue to the electronic device. A vapor chamber including a plurality of mesh structures has been widely used as a heat dissipation device to be disposed in the electronic device for dissipating the heat generated by the electronic elements.

For increasing the efficacy of heat dissipation, the conventional vapor chamber includes a plurality of mesh structures disposed in a case thereof. The plurality of mesh structures store working liquid for dissipating the heat. The plurality of mesh structures are independent from each other and stacked with each other sequentially so as to form a multi-layer structure.

However, as the plurality of mesh structures are stacked to form the multi-layer structure, each layer of the multi-layer structure is stacked on the other layer of the multi-layer structure. Since the plurality of mesh structures are independent from each other and unconnected with each other, the positions of the mesh structures may be shifted in relation to each other as each layer of the multi-layer structure is stacked on the other layer of the multi-layer structure. For avoiding the shift of the positions of the plurality of mesh structures, the plurality of mesh structures are needed to be fixed. The vapor chamber further includes a support structure disposed between the case and an area of stacking the plurality of mesh structures, so that the plurality of mesh structures are fixed by the support structure as each layer of the multi-layer structure is stacked on the other layer of the multi-layer structure. However, it is difficult to install and position the support structure in the vapor chamber. Consequently, the additional support structure employed in the vapor chamber may result in increased cost and difficulty in manufacturing and assembling the vapor chamber.

Therefore, there is a need of providing a vapor chamber and an assembly method thereof so as to address the issues encountered by the prior arts.

SUMMARY OF THE INVENTION

An object of the present disclosure provides a vapor chamber and an assembly method thereof. The vapor chamber includes a mesh structure capable of being fixed therein easily. The cost of manufacturing the vapor chamber is reduced, and the method of assembling the vapor chamber is simplified.

In accordance with an aspect of the present disclosure provides an assembly method of a vapor chamber. Firstly, a mesh structure having a main body and an extension part is provided. The main body and the extension part have a capillary-wick structure, respectively. The main body and the extension part are integrally formed into one piece. The extension part is extended outwardly from a side of the main body. Then, the extension part is folded along an intersection between the extension part and the main body. An outer surface of the extension part is allowed to be stacked on an inner surface of the main body. An overlapping area is formed by stacking the extension part on the main body. The overlapping area fails to contact with a support structure. Then, a lower case having a first concave is provided. The main body is allowed to be disposed on an inner surface of the first concave of the lower case. An upper case having a second concave is provided. The upper case is allowed to cover the lower case and assemble with the lower case. The second concave of the upper case and the first concave of the lower case collaboratively form a space. The mesh structure is accommodated within the space.

In accordance with an aspect of the present disclosure provides an assembly method of a vapor chamber. Firstly, a lower case having a first concave is provided. Then, a mesh structure having a main body and an extension part is provided. The main body is allowed to be disposed on an inner surface of the first concave of the lower case. The main body and the extension part have a capillary-wick structure, respectively. The extension part and the main body are integrally formed into one piece. The extension part is extended outwardly from a side of the main body. Then, the extension part is folded along an intersection between the extension part and the main body. An outer surface of the extension part is allowed to be stacked on an inner surface of the main body. An overlapping area is formed by stacking the extension part on the main body. The overlapping area fails to contact with a support structure. Then, an upper case having a second concave is provided. The upper case is allowed to cover the lower case and assemble with the lower case. The second concave of the upper case and the first concave of the lower case collaboratively form a space. The mesh structure is accommodated within the space.

In accordance with an aspect of the present disclosure provides a vapor chamber. The vapor chamber has a lower case, an upper case and a mesh structure. The lower case has a first concave. The upper case is assembled with the lower case and has a second concave. The first concave and second concave collaboratively form a space. The mesh structure is accommodated within the space and has a main body and an extension part. The main body and the extension part have a capillary-wick structure, respectively. The main body is accommodated in the first concave and disposed on an inner surface of the lower case. The extension part and the main body are integrally formed into one piece. The extension part is extended outwardly from a side of the main body. The extension part is folded and an outer surface of the extension part is stacked on an inner surface of the main body. The extension part is located between the upper case and the inner surface of the main body. An overlapping area is formed by stacking the extension part on the main body. The overlapping area fails to contact with a support structure.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
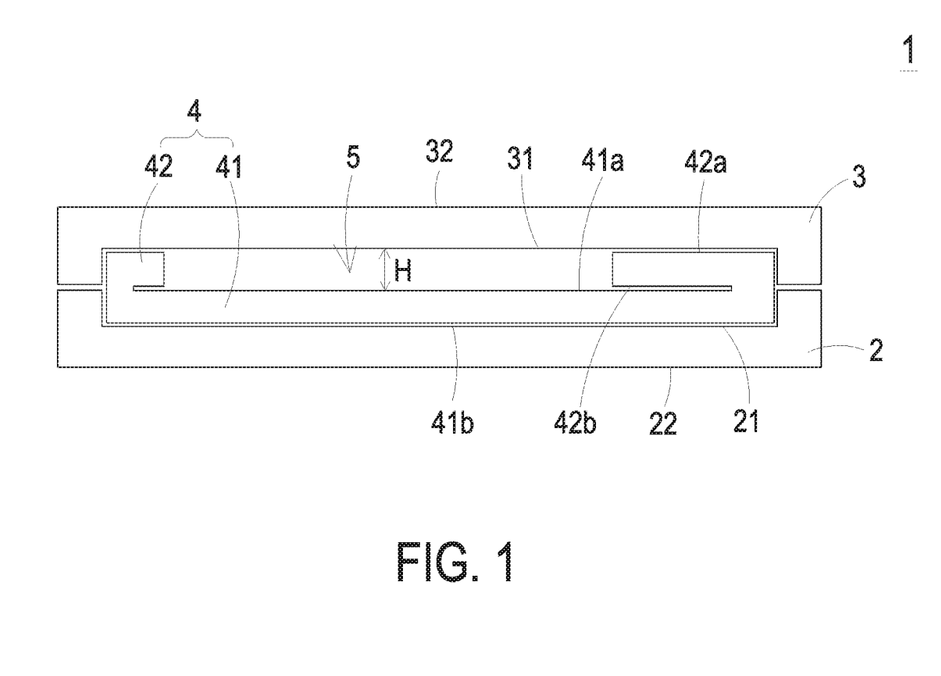
FIG. 1 is a schematic cross-sectional view illustrating a vapor chamber according to a first embodiment of the present disclosure.
Figure 2:
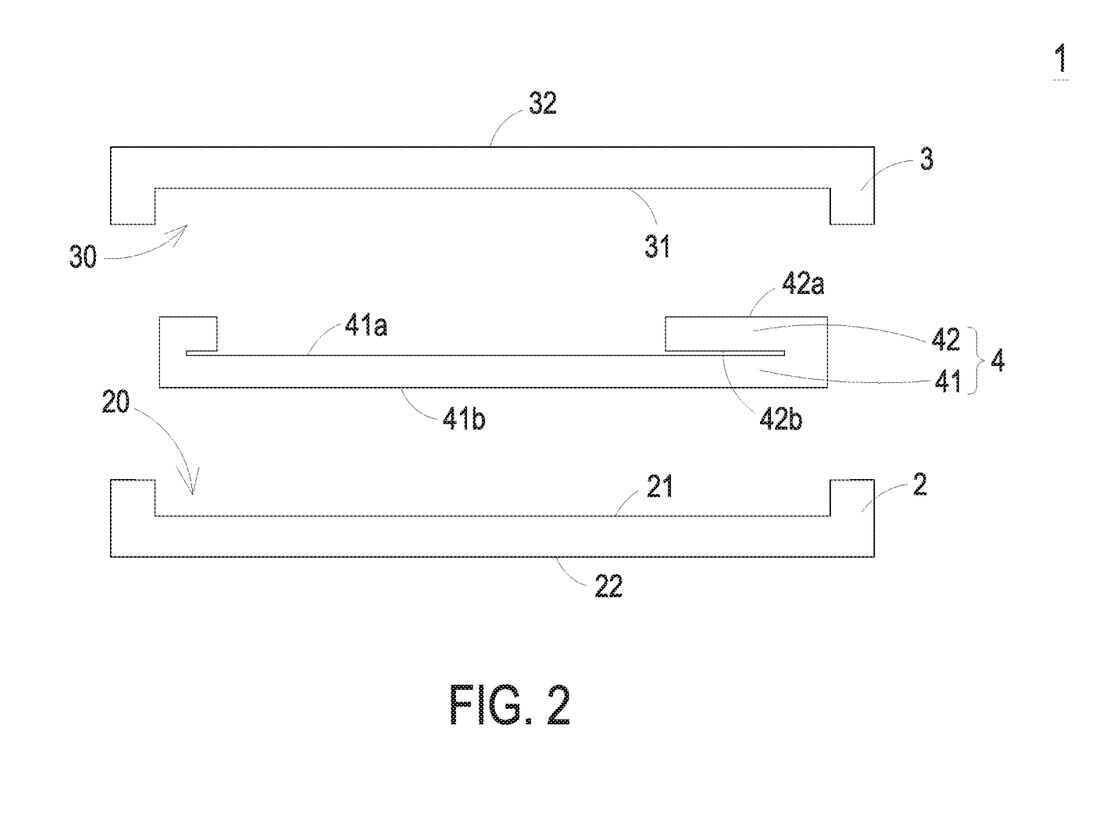
FIG. 2 is a schematic exploded view illustrating the vapor chamber of FIG. 1.
Figure 3:
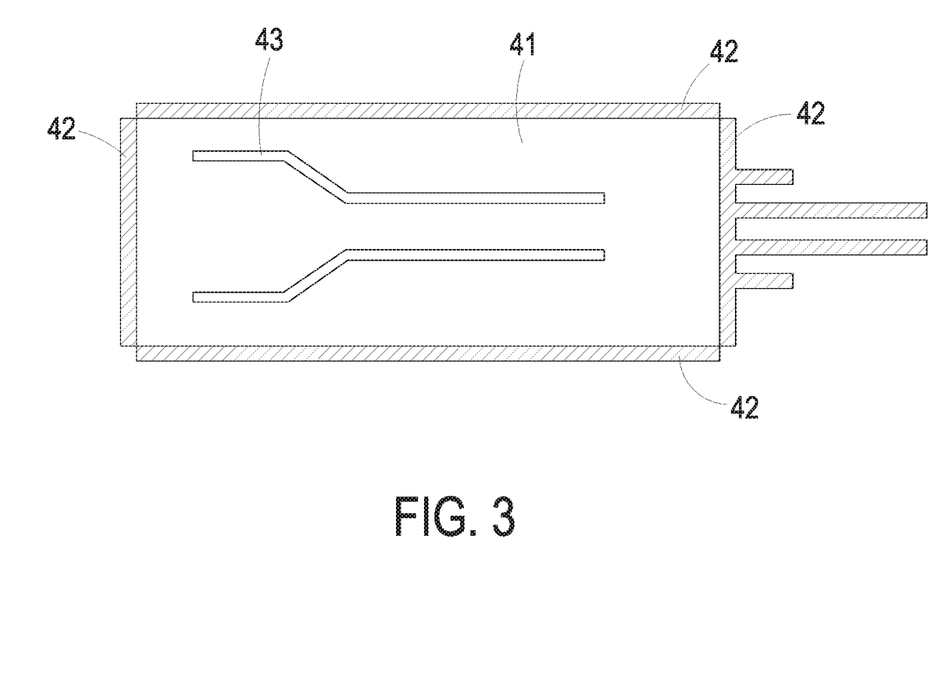
FIG. 3 is a top view illustrating a mesh structure of the vapor chamber of FIG. 1, wherein the mesh structure is not folded.
Figure 4:
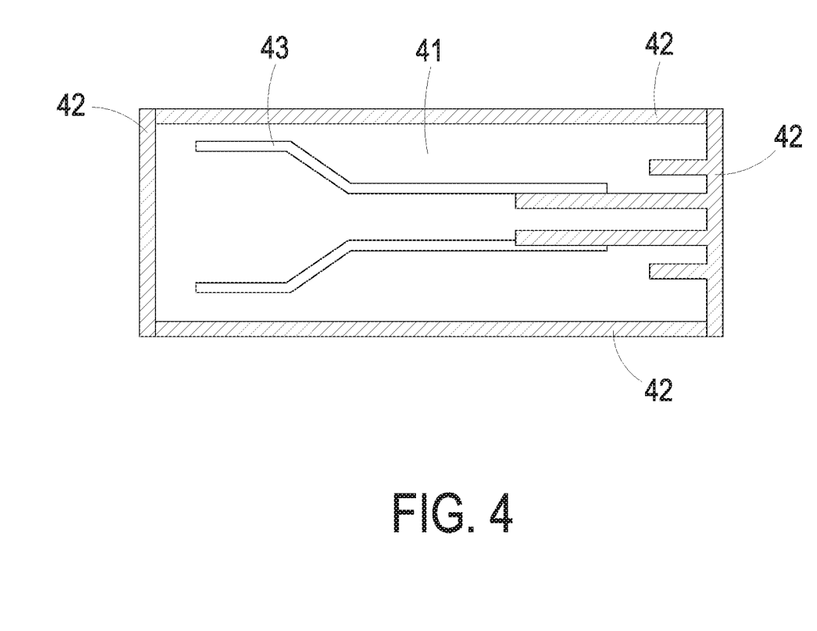
FIG. 4 is a top view illustrating the mesh structure of the vapor chamber of FIG. 1, wherein the mesh structure is folded.

FIG. 1 is a schematic cross-sectional view illustrating a vapor chamber according to a first embodiment of the present disclosure. FIG. 2 is a schematic exploded view illustrating the vapor chamber of FIG. 1. FIG. 3 is a top view illustrating a mesh structure of the vapor chamber of FIG. 1, wherein the mesh structure is not folded. FIG. 4 is a top view illustrating the mesh structure of the vapor chamber of FIG. 1, wherein the mesh structure is folded. As shown in FIGS. 1 to 4, the vapor chamber 1 of the present disclosure is disposed within an electronic device (not shown in figure) for dissipating the heat generated by an electronic component (not shown in figure) of the electronic device. The vapor chamber 1 includes a lower case 2, an upper case 3 and a single mesh structure 4. In some embodiments, the thickness of the vapor chamber 1 is less than or equal to 1 mm, but not limited thereto.

The lower case 2 is a concave structure and includes a first concave 20, a first inner surface 21 and a first outer surface 22. The first inner surface 21 is located on the bottom of the first concave 20 of the lower case 2. The first inner surface 21 faces to the upper case 3. The first outer surface 22 is opposite to the first inner surface 21 and in contact with the electronic component for receiving the heat generated by the electronic component. The upper case 3 is a concave structure and includes a second concave 30, a second inner surface 31 and a second outer surface 32. The second inner surface 31 is located on the bottom of the second concave 30 of the upper case 3. The second inner surface 31 faces to the lower case 2. The second outer surface 32 is opposite to the second inner surface 31. Moreover, the upper case 3 covers the lower case 2 and assembled with the lower case 2. Consequently, the second concave 30 of the upper case 3 and the first concave 20 of the lower case 2 collaboratively form a space 5.

The mesh structure 4 is disposed in the space 5. A part of the mesh structure 4 is in contact with the first inner surface 21 of the lower case 2. The other part of the mesh structure 4 is in contact with the second inner surface 31 of the upper case 3. The mesh structure 4 includes a main body 41 having a capillary-wick structure and an extension part 42 having a capillary-wick structure. Since the main body 41 and the extension part 42 include the capillary-wick structures, respectively, the main body 41 and the extension part 42 use the capillary action to adsorb and transport the working liquid (for example water) within the vapor chamber 1. Therefore, when the working liquid of the vapor chamber 1 adjacent to the first outer surface 22 is heated and evaporated from a liquid phase to a vapor phase, the working liquid in vapor phase is transferred to the second inner surface 31 of the upper case 3 and is condensed from the vapor phase into the liquid phase. Then, the working liquid is transported to the first inner surface 21 through the main body 41 and the extension part 42 of the mesh structure 4 for next circulation. Therefore, the vapor chamber 1 transfers the heat generated by the electronic component from the first outer surface 22 of the lower case 2 toward for example the second outer surface 32 of the upper case 3. Consequently, the efficacy of dissipating heat and maintain a uniform temperature is achieved by the vapor chamber 1.

In this embodiment, the main body 41 and the at least extension part 42 are integrally formed into one piece. The main body 41 is a rectangle structure. The main body 41 of the mesh structure 4 is accommodated within the first concave 20 and disposed on the first inner surface 21 of the lower case 2. The main body 41 includes a third inner surface 41a and a third outer surface 41b. The third inner surface 41a faces to the upper case 3. The third outer surface 41b faces to the lower case 2 and is in contact with the first inner surface 21 of the lower case 2. The extension part 42 is extended outwardly from the corresponding side of the main body 41. That is, a side of the extension part 42 is connected with the corresponding side of the main body 41. Moreover, the connection between the extension part 42 and the main body 41 is folded, and each extension part 42 is stacked on the third inner surface 41a of the main body 41 and is located between the second inner surface 31 of the upper case 3 and the third inner surface 41a of the main body 41. When the extension part 42 is stacked on the third inner surface 41a of the main body 41, a fourth outer surface 42b of the extension part 42 is in contact with the third inner surface 41a of the main body 41, and a four inner surface 42a of the extension part 42 is in contact with the second inner surface 31 of the upper case 3. Consequently, the mesh structure 4 forms a two-layer structure by folding the extension part 42 and stacking the extension part 42 on the main body 41, and an overlapping area is formed by stacking the extension part 42 on the main body 41. Moreover, since one side of the extension part 42 is connected with the corresponding side of the main body 41, when the extension part 42 is folded and stacked on the third inner surface 41a of the main body 41, the extension part 42 is not shifted easily in relation to the main body 41. Consequently, the overlapping area between the main body 41 and the extension part 42 doesn't need to contact with any support structure for fixing. For example, portion of the fourth inner surface 42a of the extension part 42 corresponding in position to the overlapping area between the main body 41 and the extension part 42 doesn't need to contact with any support structure for fixing. Portion of the third outer surface 41b of the main body 41 corresponding in position to the overlapping area between the main body 41 and the extension part 42 doesn't need to contact with any support structure for fixing.

As shown in FIGS. 3 and 4, in the embodiment, the mesh structure 4 includes a plurality of extension parts 42. For example, the mesh structure 4 includes four extension parts 42. The length of one of the four extension parts 42 is greater than the lengths of the other three of the four extension parts 42. For example, the length of the extension part 42 located in the right side of FIGS. 3 and 4 is greater than the lengths of the extension parts 42 located in the left side, the upside and the underside of FIGS. 3 and 4.

Figure 5:
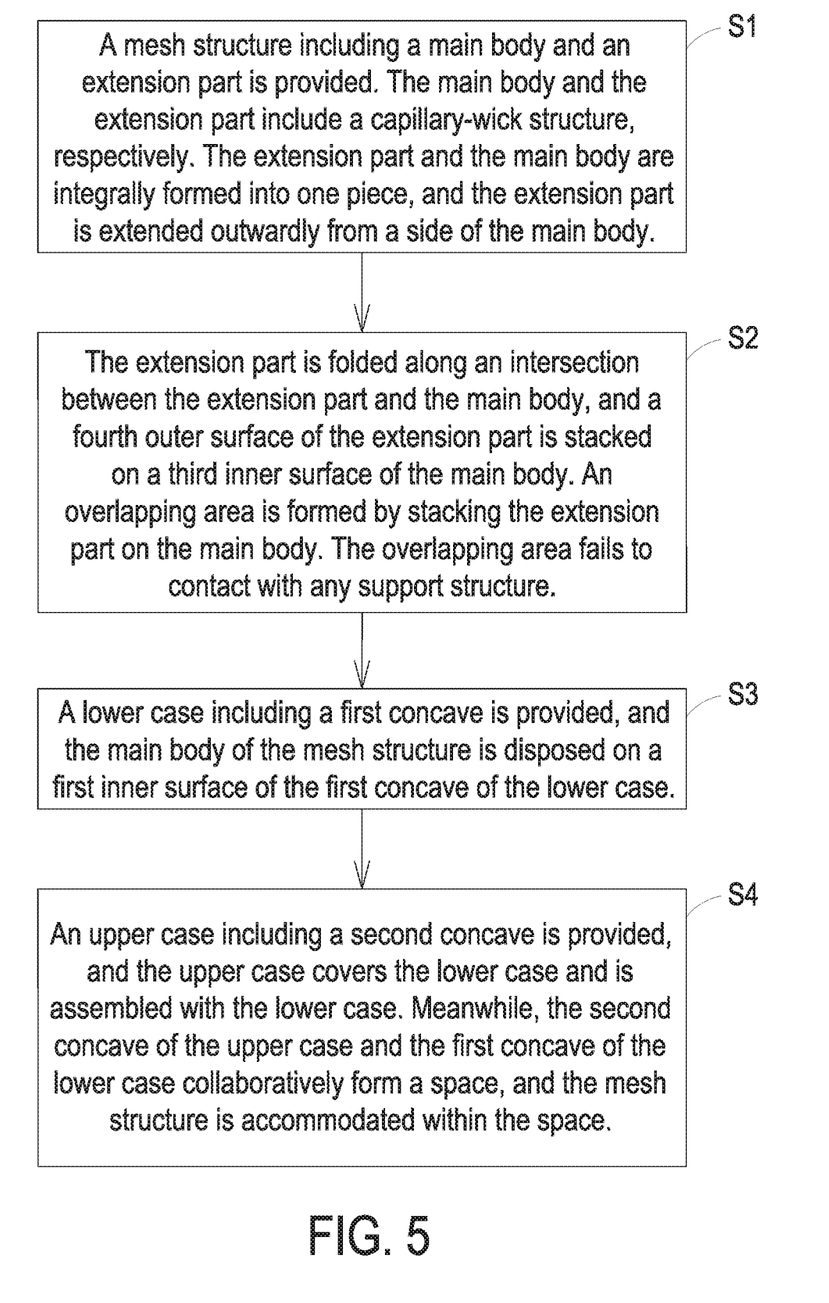
FIG. 5 is a flowchart illustrating an exemplary assembly method of the vapor chamber of FIG. 1.

FIG. 5 is a flowchart illustrating an exemplary assembly method of the vapor chamber of FIG. 1. As shown in FIGS. 1 to 5, firstly, a step S1 is performed. In the step S1, a mesh structure 4 including a main body 41 and an extension part 42 is provided. The main body 41 and the extension part 42 include capillary-wick structures, respectively. The extension part 42 and the main body 41 are integrally formed into one piece, and the extension part 42 is extended outwardly from a side of the main body 41. Then, a step S2 is performed. In the step S2, the extension part 42 is folded along an intersection between the extension part 42 and the main body 41, and a fourth outer surface 42b of the extension part 42 is stacked on a third inner surface 41a of the main body 41. An overlapping area is formed by stacking the extension part 42 on the main body 41. The overlapping area fails to contact with any support structure. Then, a step S3 is performed. In the step S3, a lower case 2 including a first concave 20 is provided, and the main body 41 of the mesh structure 4 is disposed on a first inner surface 21 of the first concave 20 of the lower case 2. Then, a step S4 is performed. In the step S4, an upper case 3 including a second concave 30 is provided, and the upper case 3 covers the lower case 2 and is assembled with the lower case 2. Meanwhile, the second concave 30 of the upper case 3 and the first concave 20 of the lower case 2 collaboratively form a space 5, and the mesh structure 4 is accommodated within the space 5.

From the above descriptions, the present disclosure provides a vapor chamber 1 including a single mesh structure. The extension part 42 of the mesh structure 4 is folded and stacked on the main body 41, so that the mesh structure 4 forms a two-layer structure. Consequently, the efficiency of the heat dissipation of the vapor chamber 1 is enhanced. Comparing with the conventional vapor chamber including a plurality of mesh structures which are independent with each other, one side of the extension part 42 is connected with the corresponding side of the main body 41. When the extension part 42 is folded and stacked on the main body 41, the extension part 42 is not shifted easily because the side of the extension part 42 is connected with the corresponding side of the main body 41. Consequently, the fourth inner surface 42a of the extension part 42 and portion of the third outer surface 41b of the main body 41 corresponding in position to the overlapping area between the main body 41 and the extension part 42 don't need to contact with any support structure for fixing.

Figure 6:
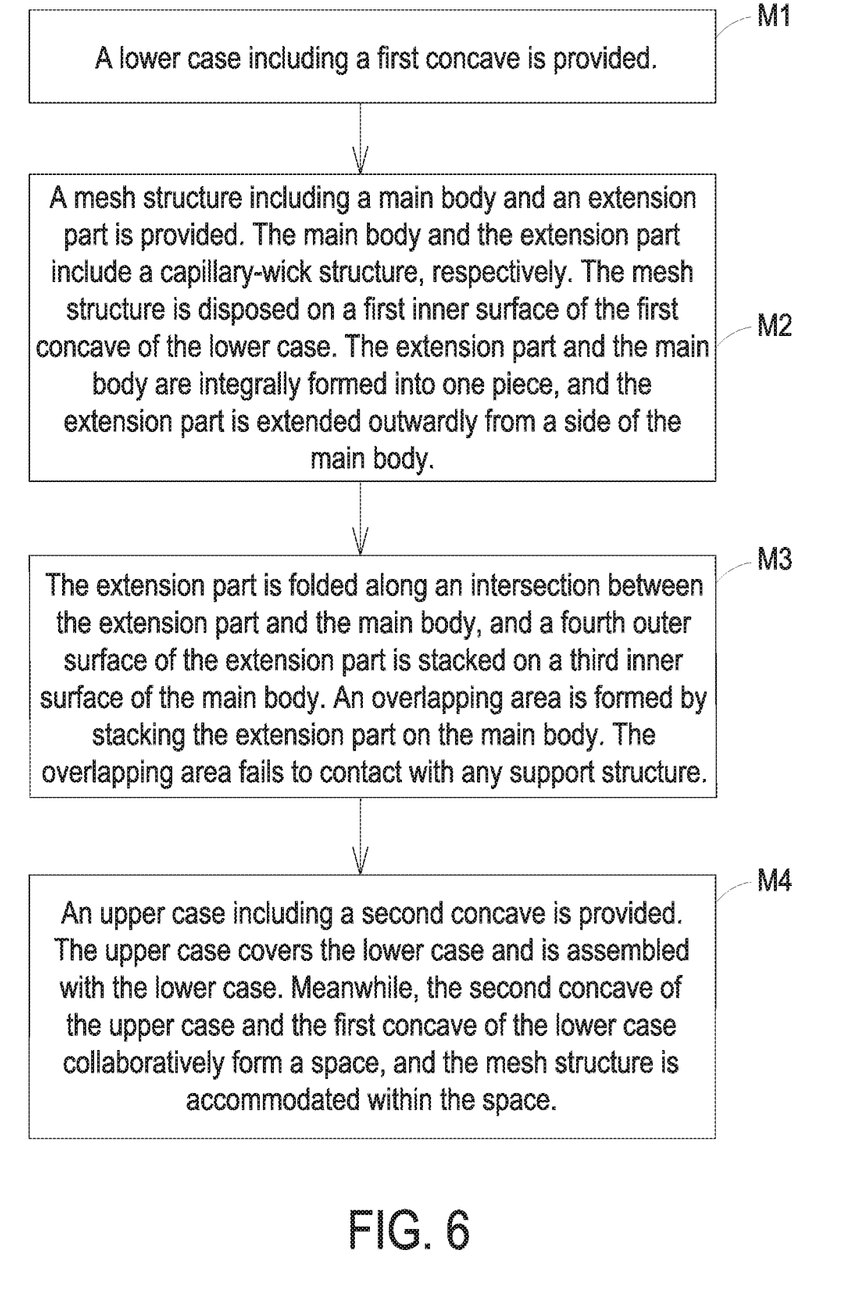
FIG. 6 is a flowchart illustrating another exemplary assembly method of the vapor chamber of FIG. 1.

FIG. 6 is a flowchart illustrating another exemplary assembly method of the vapor chamber of FIG. 1. As shown in FIG. 6, firstly, a step M1 is performed. In the step M1, a lower case 2 including a first concave 20 is provided. Then, a step M2 is performed. In the step M2, a mesh structure 4 including a main body 41 and an extension part 42 is provided. The main body 41 and the extension part 42 include capillary-wick structures, respectively. The mesh structure 4 is disposed on a first inner surface 21 of the first concave 20 of the lower case 2. The extension part 42 and the main body 41 are integrally formed into one piece, and the extension part 42 is extended outwardly from a side of the main body 41. In this embodiment, the cross-sectional area of the first concave 20 of the lower case 2 is greater than the area of the main body 41 of the mesh structure 4, so that the mesh structure 4 is easy to be disposed on the first inner surface 21 of the first concave 20 of the lower case 2. Then, a step M3 is performed. In the step M3, the extension part 42 is folded along an intersection between the extension part 42 and the main body 41, and a fourth outer surface 42b of the extension part 42 is stacked on a third inner surface 41a of the main body 41. An overlapping area is formed by stacking the extension part 42 on the main body 41. The overlapping area fails to contact with any support structure. Then, a step M4 is performed. In the step M4, an upper case 3 including a second concave 30 is provided. The upper case 3 covers the lower case 2 and is assembled with the lower case 2. Meanwhile, the second concave 30 of the upper case 3 and the first concave 20 of the lower case 2 collaboratively form a space 5, and the mesh structure 4 is accommodated within the space 5.

Please refer to FIGS. 1 to 4 again. Since the heat generated by the electronic component is received by the first outer surface 22 of the lower case 2, the working liquid in the vapor chamber 1 and adjacent to the first outer surface 22 of the lower case 2 is evaporated easily to form a steam flow. For allowing the steam flow to circulate and flow in the vapor chamber 1 smoothly, in some embodiments, a gap H is formed between the second inner surface 31 of the upper case 3 and the third inner surface 41a of the main body 41 for allowing the steam flow to circulate. Therefore, the efficacy of the heat dissipation of the vapor chamber 1 is enhanced. Moreover, in some other embodiments, the main body 41 of the mesh structure 4 has a hollow channel 43. For example, the main body 41 of the mesh structure 4 has two hollow channels 43, as shown in FIG. 3. The hollow channel 43 is a strip structure. The steam flow is flowed within the hollow channel 43. Therefore, the efficacy of the heat dissipation of the vapor chamber 1 is enhanced.

Figure 7:
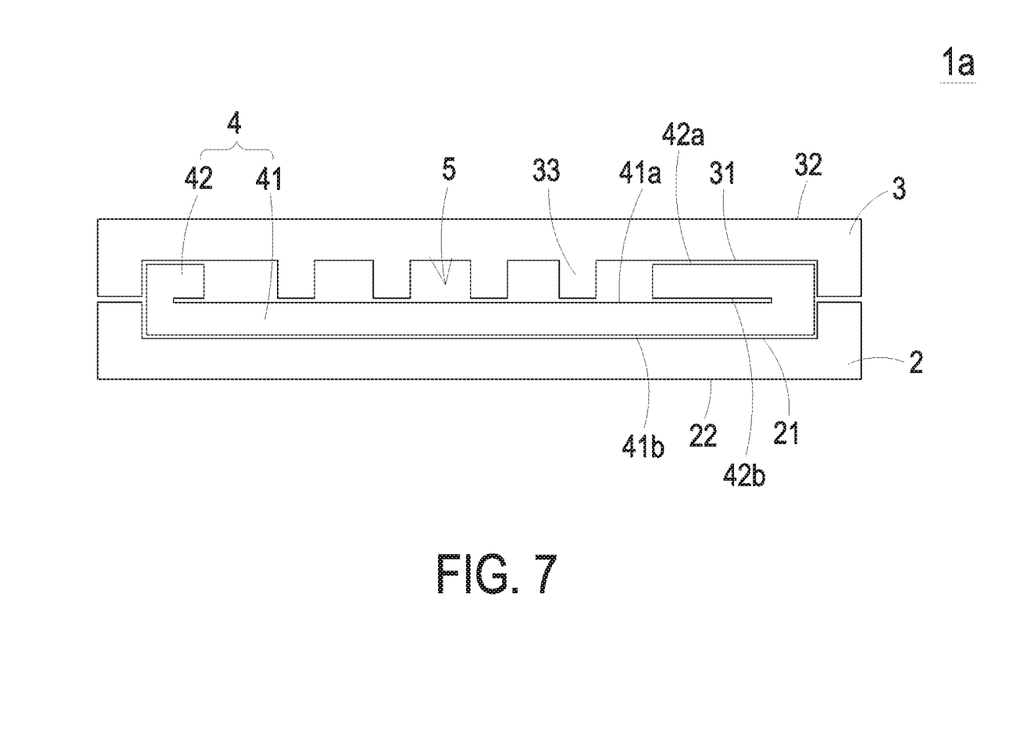
FIG. 7 is a schematic cross-sectional view illustrating a vapor chamber according to a second embodiment of the present disclosure.

FIG. 7 is a schematic cross-sectional view illustrating a vapor chamber according to a second embodiment of the present disclosure. As shown in FIG. 7, the vapor chamber 1a of this embodiment includes an upper case 2, a lower case 3 and a mesh structure 4. The structures and functions of the upper case 2, the lower case 3 and the mesh structure 4 of the vapor chamber 1a of this embodiment are similar to those of the first embodiment. Component parts and elements corresponding to those of the first embodiment are designated by identical numeral references, and detailed descriptions thereof are omitted. Different from the upper case 3 of the vapor chamber 1 of FIG. 1, in this embodiment, the upper case 3 of the vapor chamber 1a further includes at least one support pillar 33. For example, as shown in FIG. 7, the upper case 3 of the vapor chamber 1a includes a plurality of support pillars 33. Each of the plurality of support pillars 33 is extended outwardly from the second inner surface 31 of the upper case 3 toward the lower case 2. When the upper case 3 is assembled with the lower case 2, an end of each support pillar is in contact with the third inner surface 41a of the main body 41 so as to prevent the mesh structure 4 disposed within the first concave 20 of the lower case 2 from shifting. In some embodiments, the plurality of support pillars 33 are arranged in a row, in arrays or in staggered manner. In other embodiments, the distance between each support pillar 33 and the other support pillar 33 which is adjacent to the support pillar 33 is constant, but it is not limited thereto.

Figure 8:
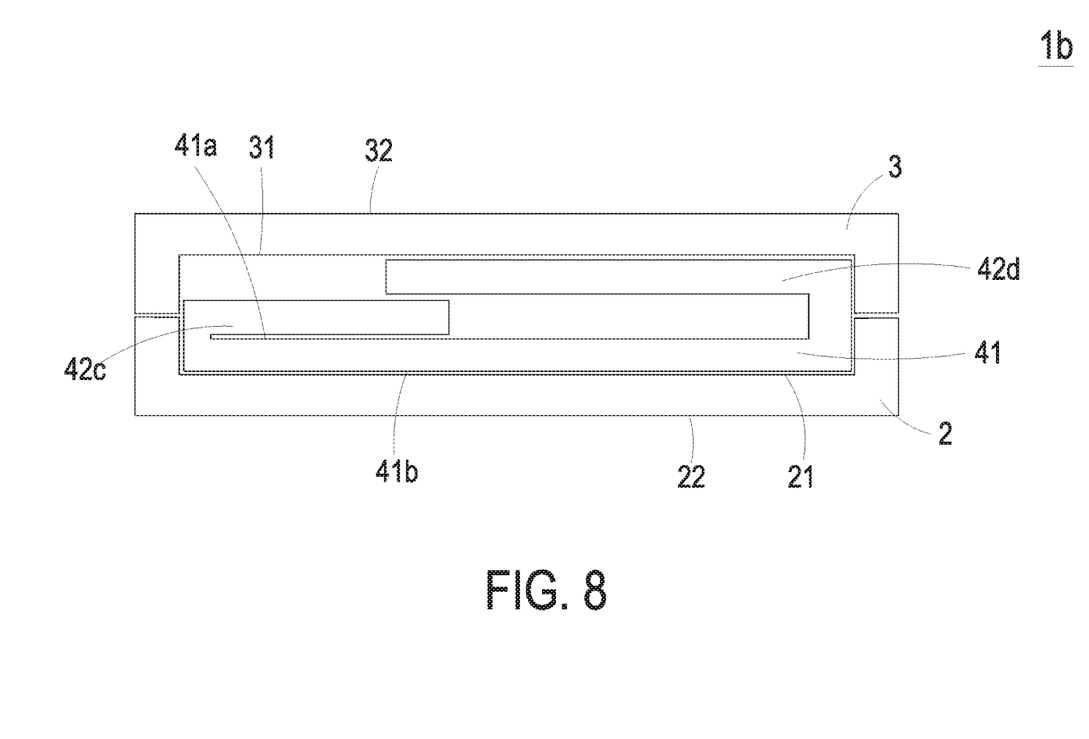
FIG. 8 is a schematic cross-sectional view illustrating a vapor chamber according to a third embodiment of the present disclosure.
Figure 9:
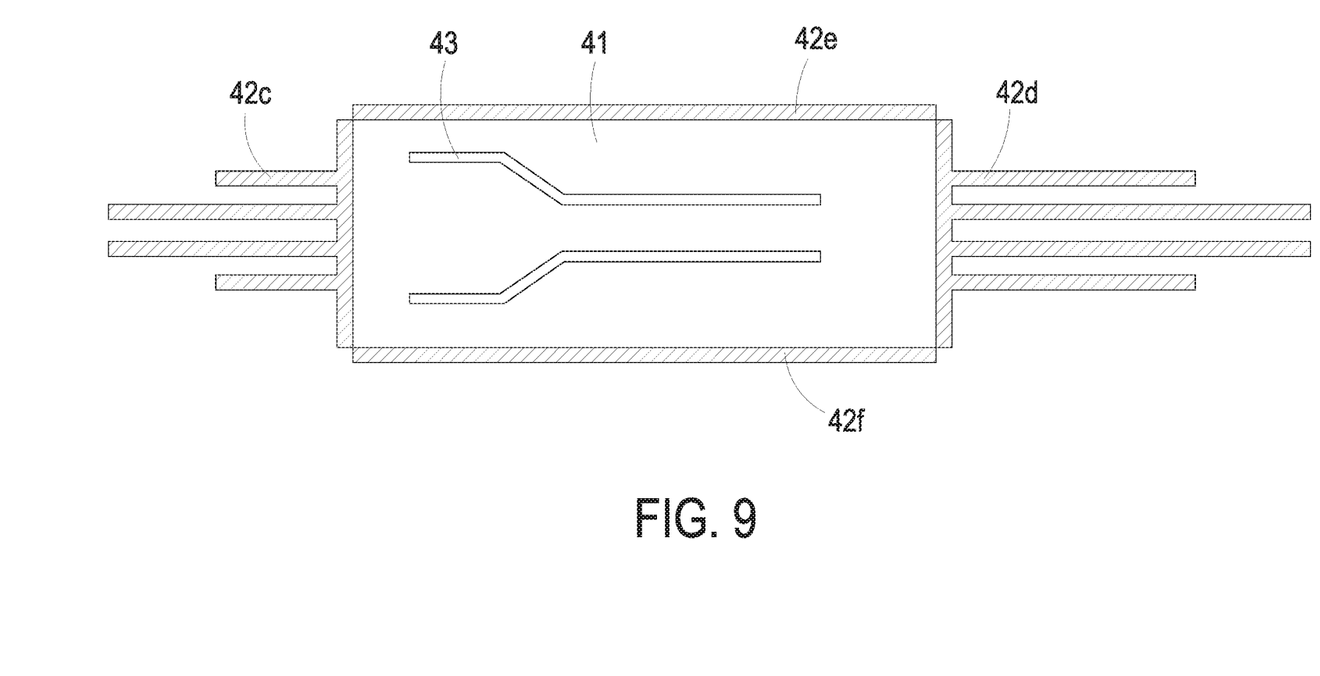
FIG. 9 is a top view illustrating a mesh structure of the vapor chamber of FIG. 8, wherein the mesh structure is not folded.
Figure 10:
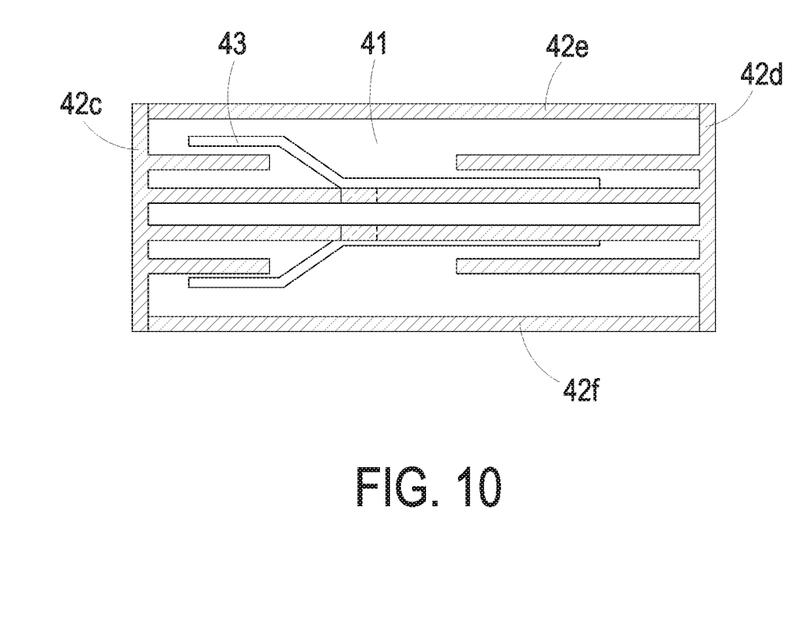
FIG. 10 is a top view illustrating the mesh structure of the vapor chamber of FIG. 8, wherein the mesh structure is folded.

FIG. 8 is a schematic cross-sectional view illustrating a vapor chamber according to a third embodiment of the present disclosure. FIG. 9 is a top view illustrating a mesh structure of the vapor chamber of FIG. 8, wherein the mesh structure is not folded. FIG. 10 is a top view illustrating the mesh structure of the vapor chamber of FIG. 8, wherein the mesh structure is folded. As shown in FIGS. 8 to 10, a vapor chamber 1b of this embodiment includes an upper case 2, a lower case 3 and a mesh structure 4. The structures and functions of the upper case 2, the lower case 3 and the mesh structure 4 of the vapor chamber 1b of this embodiment are similar to those of the first embodiment. Component parts and elements corresponding to those of the first embodiment are designated by identical numeral references, and detailed descriptions thereof are omitted. Different from the mesh structure 4 of the vapor chamber 1 of FIG. 1, in this embodiment, the mesh structure 4 of the vapor chamber 1b includes a plurality of extension parts. For describing the features of this embodiment, the plurality of extension parts includes a first extension part 42c, a second extension part 42d, a third extension part 42e and a fourth extension part 42f. The first extension part 42c is extended outwardly from a first side of the plurality of sides of the main body 41. For example, the first extension part 42c is extended outwardly from the left side of the main body 41 of FIG. 9. The first extension part 42c is folded and stacked on the third inner surface 41a of the main body 41.

The second extension part 42d is extended outwardly from a second side of the plurality of sides of the main body 41. The second side is opposite to the first side. For example, the first extension part 42c is extended outwardly from the right side of the main body 41 of FIG. 9. The second extension part 42d is folded and stacked on at least portion of the first extension part 42c. Therefore, the mesh structure 4 forms a three-layer structure constructed by the main body 41, the first extension part 42c and the second extension part 42d. In some embodiments, the third extension part 42e and the fourth extension part 42f are extended outwardly from a third side and a fourth side of the plurality of sides of the main body 41, respectively. For example, the third extension part 42e and the fourth extension part 42f are extended outwardly from the upside and the underside of the main body 41, respectively. The third extension part 42e and the fourth extension part 42f are folded and stacked on the third inner surface 41a of the main body 41.

From the above descriptions, the present disclosure provides a vapor chamber including a single mesh structure. The extension part of the mesh structure is folded and stacked on the main body, so that the mesh structure forms a two-layer structure. Consequently, the efficiency of the heat dissipation of the vapor chamber is enhanced. Comparing with the conventional vapor chamber including a plurality of mesh structures which are independent with each other, one side of the extension part is connected with the corresponding side of the main body. When the extension part is folded and stacked on the main body, the extension part is not shifted easily because the side of the extension part is connected with the corresponding side of the main body. Consequently, the fourth inner surface of the extension part and portion of the third outer surface of the main body corresponding in position to the overlapping area between the main body and the extension part don't need to contact with any support structure for fixing.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An assembly method of a vapor chamber, the assembly method comprising steps of:
   (a) providing a mesh structure having a main body and an extension part, wherein the main body and the extension part have a capillary-wick structure, respectively, and the main body and the extension part are integrally formed into one piece, and the extension part is extended outwardly from a side of the main body;
   (b) folding the extension part along an intersection between the extension part and the main body and allowing an outer surface of the extension part to be stacked on and in contact with an inner surface of the main body, wherein an overlapping area is formed by stacking the extension part on the main body;
   (c) providing a lower case having a first concave and allowing the main body to be disposed on and in contact with an inner surface of the first concave of the lower case; and
   (d) providing an upper case having a second concave and allowing the upper case to cover the lower case and assemble with the lower case, wherein the second concave of the upper case and the first concave of the lower case collaboratively form a space, and the mesh structure is accommodated within the space, wherein a portion of an inner surface of the extension part is in contact with an inner surface of the upper case.

2. The assembly method according to claim 1, wherein in the step (d), a gap is formed between the inner surface of the upper case and the inner surface of the main body.

3. The assembly method according to claim 1, wherein the main body has a hollow channel, and the hollow channel is a strip structure.

4. The assembly method according to claim 1, wherein a thickness of the vapor chamber is less than or equal to 1 mm.

5. An assembly method of a vapor chamber, the assembly method comprising steps of:
   (a) providing a lower case having a first concave;
   (b) providing a mesh structure having a main body and an extension part, and allowing the main body to be disposed on and in contact with an inner surface of the first concave of the lower case, wherein the main body and the extension part have a capillary-wick structure, respectively, the extension part and the main body are integrally formed into one piece, and the extension part is extended outwardly from a side of the main body;
   (c) folding the extension part along an intersection between the extension part and the main body, and allowing an outer surface of the extension part to be stacked on and in contact with an inner surface of the main body, wherein an overlapping area is formed by stacking the extension part on the main body; and (d) providing an upper case having a second concave, and allowing the upper case to cover the lower case and assemble with the lower case, wherein the second concave of the upper case and the first concave of the lower case collaboratively form a space, and the mesh structure is accommodated within the space, wherein a portion of an inner surface of the extension part is in contact with an inner surface of the upper case.

6. The assembly method according to claim 5, wherein the inner surface of the extension part corresponding in position to the overlapping area fails to contact with a support structure, and an outer surface of the main body corresponding in position to the overlapping area fails to contact with the support structure.

7. The assembly method according to claim 5, wherein in the step (d), a gap is formed between the inner surface of the upper case and the inner surface of the main body.

8. The assembly method according to claim 5, wherein the main body has a hollow channel, and the hollow channel is a strip structure.

9. The assembly method according to claim 5, wherein a thickness of the vapor chamber is less than or equal to 1 mm.

\* \* \* \* \*